United States Patent [19]

Burger et al.

[11] Patent Number: 5,659,321
[45] Date of Patent: Aug. 19, 1997

[54] RADAR DISTANCE MEASURING DEVICE

[75] Inventors: Stefan Burger, Freiburg; Johanngeorg Otto, Aalen-Hofherrnweiler, both of Germany

[73] Assignee: Endress+Hauser GmbH+Co., Maulburg, Germany

[21] Appl. No.: 433,440

[22] PCT Filed: Sep. 12, 1994

[86] PCT No.: PCT/EP94/03044

§ 371 Date: May 10, 1995

§ 102(e) Date: May 10, 1995

[87] PCT Pub. No.: WO95/08128

PCT Pub. Date: Mar. 23, 1995

[30] Foreign Application Priority Data

Sep. 15, 1993 [DE] Germany .................. 43 31 353.1

[51] Int. Cl.$^6$ .................................................. G01S 13/08
[52] U.S. Cl. ................................................ 342/124; 342/128
[58] Field of Search ........................... 342/118, 122, 342/124, 128; 367/908; 73/290 R

[56] References Cited

U.S. PATENT DOCUMENTS

| | | | |
|---|---|---|---|
| 4,044,353 | 8/1977 | Levy ............................... | 342/124 |
| 4,238,795 | 12/1980 | Schiek et al. ..................... | 342/127 |
| 4,443,792 | 4/1984 | Pidgeon et al. ................... | 342/124 |
| 4,665,403 | 5/1987 | Edvardsson ....................... | 342/124 |
| 4,973,966 | 11/1990 | Zeewy ............................. | 342/61 |
| 5,212,835 | 5/1993 | Suzuki ............................ | 455/330 |
| 5,229,774 | 7/1993 | Komatsu .......................... | 342/70 |
| 5,365,178 | 11/1994 | Van Der Pol ..................... | 342/124 |
| 5,387,918 | 2/1995 | Weisbeck et al. ................. | 342/128 |

FOREIGN PATENT DOCUMENTS

| | | |
|---|---|---|
| 48-11987 | 2/1973 | Japan . |
| 55-96691 | 7/1980 | Japan . |
| 60-262080 | 12/1985 | Japan . |
| 2-142205 | 5/1990 | Japan . |

*Primary Examiner*—Ian J. Lobo
*Attorney, Agent, or Firm*—Bose McKinney & Evans

[57] ABSTRACT

A conventional radar module (1) for level measurements is designed for operation within a specific, narrowly restricted frequency range. To enable level measurements to be implemented at a substantially higher frequency without involving any change in the existing radar module (1) whatsoever, a frequency converter circuit (2) is inserted between the duplexer antenna (7) designed for said higher frequency and the antenna port (A) of the radar module (1). This frequency converter circuit (2) which can be realized at small expense converts the lower frequency into the higher frequency in the direction from the radar module (1) to the antenna (7) and the higher frequency into the lower frequency in the opposite direction.

3 Claims, 2 Drawing Sheets

RADAR DISTANCE MEASURING DEVICE

BACKGROUND OF THE INVENTION

1. Field of the Invention

This invention relates to a distance measuring device, particularly a level measuring device, as well as to a frequency converter circuit for use in said radar distance measuring device.

2. Description of the Prior Art

For non-contacting distance measurement by means of microwaves, particularly pulsed radar and frequency modulated continuous wave radar (FMCW radar) are known. In pulsed radar short microwave transmission pulses are emitted periodically which are reflected by the object being measured and re-received as an echo signal after a transit time depending on the distance involved. In pulsed radar the location in time of the echo signal within each transmission/reception period directly corresponds to the distance of the object being measured. In FMCW radar a continuous microwave is emitted which is periodically linearly frequency modulated, for example, according to a saw-tooth function. The frequency of each received echo signal thus exhibits with respect to the instantaneous frequency which the transmission signal has at the time of reception, a difference in frequency which depends on the transit time of the echo signal. The difference between the frequency of the transmission signal and that of the reception signal which may be obtained by mixing both signals and evaluating the Fourier spectrum of the mixed signal, thus corresponds to the distance of the reflecting surface of the object from the duplexer antenna.

In radar distance measurement the intention is to permit resolving several objects arranged at short distances one behind the other in the propagation path of the microwaves and having more or less the same degree of reflection, to be able to distinguish the object to be measured, particularly the surface of the material in the container, from structures incorporated in the container and the like. For a specified distance resolution of 15 cm the length of the emitted pulses in a pulsed radar arrangement must not exceed a maximum of 1 ns. For the same distance resolution when using the FMCW method the frequency of the transmission signal must permit changing by at least 1 GHz, e.g. from 4.8 GHz to 5.8 GHz. Higher transmission frequencies of, for instance 24 GHz are of advantage in that due to the improved focussing measurements are possible in small or slim containers, a higher gain is achieved with smaller antennas, and high-frequency lead-through on containers having a high internal pressure is simplified. However, employing elevated transmission frequencies is made less attractive by the increased expense thereof. Furthermore, applications exist in which the use of a lower transmission frequency is more favorable, for example in the case of liquid surfaces which tend to foam. There is thus a need for radar distance measuring devices which are capable of operating at an elevated transmission frequency; at the same time there is a continuing requirement for radar distance measuring devices which operate with a relatively low transmission frequency of, for instance, 5.8 GHz.

SUMMARY OF THE INVENTION

Available level measuring devices are, however, designed for a specific frequency range, as a result of which conventional distance measuring devices are restricted in their possibilities of application.

By means of the invention it is now possible at moderate expense to extend the applicational range of existing radar distance measuring devices, particularly level measuring devices, to substantially higher frequencies. The basis is a radar distance measuring device comprising a radar module, which is provided with e.g. a generator for producing microwaves in a relatively low frequency range, a beam splitter, a mixer, a coupler and an evaluation circuit. The beam splitter has an input connected to the output of the generator, and two outputs. The mixer is provided with an output and two inputs of which the first is connected to one of the outputs of the beam splitter and the second to one of the three ports of the coupler. The other output of the beam splitter is connected to a further port of the coupler. The third port of the coupler forms an antenna port to which a duplexer antenna may be connected, which is designed for the relatively low frequency range, for example of 5.8 GHz. By means of this duplexer antenna transmission waves having a frequency located within this frequency range may be emitted to the surface of an object, whose distance from the antenna is to be measured. Via the same antenna the echo waves reflected from the surface of the object are received. In conclusion, the output of the mixer is connected to the evaluation circuit of the radar module which establishes from the output signals of the latter the transit time of the microwaves to the surface of the object, from which the distance thereof is determined.

By using the same radar module with no change thereof and designed for a relatively low transmission frequency, the invention now makes it possible for it to operate, when required, at a significantly higher transmission frequency. According to the invention a frequency converter circuit is provided which may be inserted between the antenna port of the unchanged radar module and a duplexer antenna preferably designed for the higher frequency range. This frequency converter circuit contains a bidirectional signal path between an input/output port connectable to the antenna port of the radar module and an own antenna port, as well as a local oscillator and a mixer which converts both the frequency $f_1$ of the signals at the input/output port by mixing it with the frequency $f_2$ of the local oscillator into the higher frequency $f_3$ with which the signals are output at the own antenna port, and converts the frequency $f_3$ of the signals received at this antenna port by mixing it with the frequency $f_2$ of the local oscillator into the frequency $f_1$ with which the signals are output at the input/output port. Although the transmission waves with which the distance measurement is made, lie in a frequency range which is a multiple higher than the operating frequency of the radar module, only signals having the operating frequency of this radar module are processed therein. Accordingly no changes need to be made to the radar module whatsoever. The expense of achieving this frequency converter circuit is substantially less than that of a new concept of the distance measuring device as a whole. It is also less than in the case of a possibly contemplated use of a frequency conversion within an existing overall concept of the distance measuring device. In one preferred embodiment of the invention the frequency converter circuit thus comprises merely a local oscillator, a mixer, preferably a low-pass filter and, if necessary, a high-pass filter. Of the three ports of the mixer the first is connected to the output of the local oscillator, the second to a port of the low-pass filter and the third to the one port of the high-pass filter. The second port of the low-pass filter is connected to the antenna port of the radar module, and the duplexer antenna is applied to the second port of the high-pass filter, forming the antenna port of the interposed frequency converter circuit. The cutoff frequency of the low-pass filter lies preferably at the upper end of the low frequency range, and that of the high-pass filter preferably at the lower end of the higher frequency range. In this arrangement the existing distance measuring device "sees" only signals within the first frequency range, and the duplexer antenna is operated only with signals within the second frequency range.

The frequency ranges around 5.8 GHz and 24.125 GHz are industrial bands which offer the possibility of operating radar distance measuring devices outside of closed metallic containers. Of advantage are thus emobodiments in which the radar module operates at the frequency of 5.8 GHz and the frequency converter circuit coverts this value to an elevated transmission frequency of roughly 24 GHz.

Further features and advantages of the invention will be appreciated from the following descriptive disclosure when considered in conjunction with the accompanying drawings in which:

DETAILED DESCRIPTION

Figure 1:
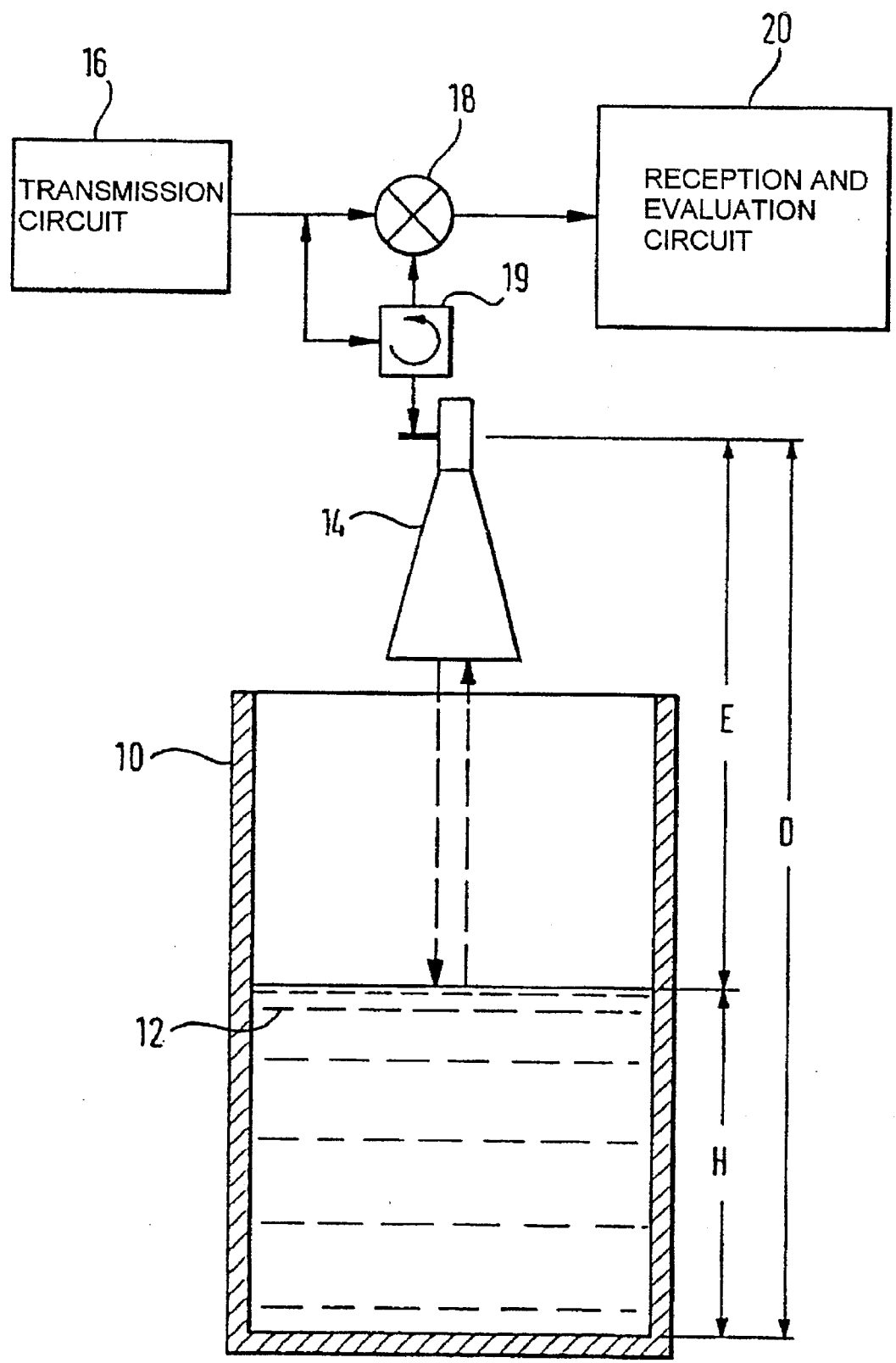
FIG. 1 depicts the basic principle of a distance measuring device operating with microwaves.

FIG. 1 shows, as the preferred application, measurement of the level in a container 10 which is filled up to a level H with a material 12.

For measuring the level H an antenna 14 is mounted above the container 10, which antenna is able to transmit an electromagnetic wave toward the surface of the material 12 and to receive the echo wave due to reflection at the surface. The transmitted electromagnetic wave is produced by a transmission circuit 16, the output of which is connected to both a frequency mixer 18 and to a circulator 19, to which the antenna 14 is connected. The frequency mixer 18 is further connected to the circulator 19 and to a reception and evaluation circuit 20 which determines from the transmission signal applied to the antenna 14 by the transmission circuit 16 and from the reception signals furnished by the antenna 14 the distance E between the antenna 14 and the surface of the material 12. Since the distance D of the antenna 14 from the bottom of the container 10 is known, the difference between this distance D and the measured distance E produces the wanted material level H.

To achieve low noise reflections relatively short waves need to be used which are in the microwave range. The antenna 14 is naturally designed for transmitting and receiving such short waves: it being equipped, for example, with a horn radiator as is indicated in FIG. 1.

For the measurement of the distance E any known radar method may be employed. All such methods are based on the principle that the transit time of the electromagnetic waves from the antenna to the reflecting surface and back to the antenna again is measured. Since the speed of propagation of the electromagnetic waves is known it is possible to compute the path travelled from the transit time measured.

One known radar method is pulsed radar, in the case of which short pulses are periodically transmitted and in a reception phase following each transmission of a pulse the echo signals at the frequency of the transmitted pulse are detected. In this case the signal amplitude received in the course of each reception phase against time will directly constitute the echo function. Each value of this echo function corresponds to the amplitude of an echo due to reflection at a certain distance from the antenna. The position of the useful echo in the echo function will therefore directly indicate the distance to be measured.

Direct transit time measurement is avoided in the frequency modulated continuous wave method (FMCW method). In this method a continuous microwave is transmitted, which is periodically linearly frequency modulated, for example in accordance with a saw-tooth function. The frequency of each received echo signal consequently differs in frequency from the instantaneous frequency, which the transmitted signal has at the time of reception, by an amount which is dependent on the transit time of the echo signal. The difference in frequency between the transmitted signal and the received signal, which may be obtained by mixing the two signals and evaluating the Fourier spectrum of the mixed signal, accordingly corresponds to the distance of the reflecting surface from the antenna.

Figure 2:
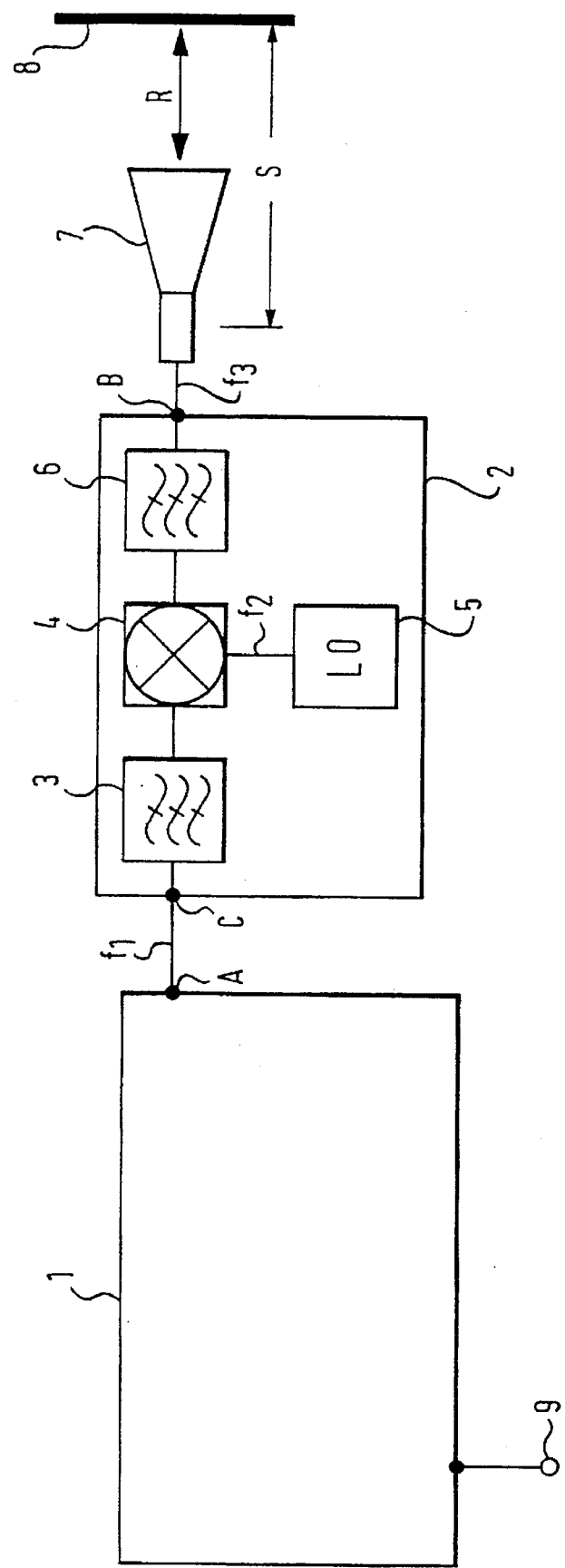
FIG. 2 is a block diagram of a distance measuring device according to the invention.

In the block diagram shown in FIG. 2 a radar module 1 of conventional design is shown within the frame line. This radar module 1 may be composed of individual components, but preferably it is achieved as a complete circuit on a substrate. Within the radar module 1 a generator is provided for generating microwaves of the frequency $f_1$ located within a first frequency range and amounting to 5.8 GHz, for example.

Radar module 1 is provided with an antenna port A to which a duplexer antenna may be connected by conventional means and which is suitable, if required, for the frequency $f_1$. At an output 9 of the radar module 1 the measurement values output by the latter are available.

The arrangement described as above constitutes a conventional level measuring device under the assumption that a duplexer antenna designed for the frequency $f_1$ is applied to the antenna port A of the radar module 1.

In accordance with the invention as illustrated in FIG. 2, however, it is provided for that instead of the duplexer antenna designed for the frequency $f_1$, a frequency converter circuit 2 may be connected to the antenna port A, if required, which frequency divider in turn feeds a duplexer antenna 7 designed for a much higher frequency range, the latter being again represented as a horn antenna. The object whose distance S from this antenna 7 is to be measured, is represented symbolically opposite the horn aperture and identified by 8. In a level measuring device the surface of the object 8 is formed by the surface of the material in the container (FIG. 1). The frequency $f_3$ at which the duplexer antenna 7 is operated may amount to three times the frequency $f_1$ and is preferably in the region of 24 GHz.

The frequency converter circuit 2 may be of very simple configuration. In the preferred embodiment shown in FIG. 2 it comprises a mixer 4, a local oscillator 5, a low-pass filter 3 and a high-pass filter 6. The low-pass filter 3, the cut-off frequency of which lies somewhat higher than the frequency $f_1$, for example at 7 GHz, is connected at its first port to an input/output connection C which may be connected to the antenna port A of the radar module 1, and at its second port to one of the three ports of the mixer 4. The second port of the mixer 4 is connected to the first port of the high-pass filter 6, the cut-off frequency of which is slightly lower than the frequency $f_3$, for example at 23 GHz. The second port of the high-pass filter 6 forms the antenna port B for the duplexer antenna 7. In conclusion the third port of the mixer 4 is fed by the local oscillator 5 with a frequency, the value of which determines the relationship between the frequencies $f_1$ and $f_3$. If the frequency $f_1$ is 5.8 GHz and the frequency $f_3$ is 24 GHz, the frequency of the local oscillator 5 must be 18.2 GHz.

The signal having the frequency $f_1$ arriving at the input/output port C of the frequency converter circuit 2 is applied via the low-pass filter 3 to the mixer 4 where it is mixed with the frequency $f_2$ of the local oscillator 5, so that, as is known, the frequencies $$f_3 = f_2 + f_1$$

and $$f_4 = f_2 - f_1$$

result. The mixer 4 must be designed for the bandwidth required in each case. The frequency converter circuit 2 forms a bidirectional signal path between the input/output port C and the antenna port B. Reciprocally the signals reflected by the surface of the object 8 are applied from antenna port B and via the high-pass filter 6 at the frequency $f_3$ to the mixer 4 and are converted with the frequency $f_2$ of the local oscillator 5 by mixing, resulting in the frequencies $$f_5 = f_3 + f_2$$

and $$f_6 = f_3 - f_2.$$

The way in which the level measuring device operates will now be described.

The frequency $f_1$ of the microwave signal output at the antenna port A of the radar module 1 is converted by the frequency converter circuit 2 into the frequency $f_3$ and radiated by the duplexer antenna 7 to the surface of the object 8. The echo signal R reflected back from the surface of the object 8 is received by the duplexer antenna 7 and transformed back by the frequency converter circuit 2 into the frequency $f_1$. This signal appears at the antenna port A of the radar module 1 and is applied to its evaluation circuit for further processing. This evaluation circuit establishes in particular from the time position of the echo signal within each transmission/reception phase the transit time of the microwaves between a reference point of the duplexer antenna 7 and the surface of the object 8 to determine from the transit time via the known propagation rate of the microwaves the distance S or—relative to the level measurement according to FIG. 1—the level H.

In the frequency converter circuit 2 the mixer 4 forms the frequency $f_3 = f_2 + f_1$ for the transmission procedure by additive mixing. The frequency $f_4 = f_2 - f_1$ generated at the same time is suppressed by the high-pass filter 6 which allows only the frequency $f_3$ to pass to the duplexer antenna 7. The echo signals R of the frequency $f_3$ received by this antenna 7 pass through the high-pass filter 6 unobstructed and attain the mixer 4 which mixes them down to the frequency $f_6 = f_3 - f_2$. The frequency $f_6$ is identical to the frequency $f_1$, as can be easily verified by inserting it in the above equation for $f_6$. The echo signals mixed down to the frequency $f_1$ then pass unobstructed through the low-pass filter 3 which keeps all higher frequencies away from the antenna port A of the radar module 1. The radar module 1 thus "sees" only signals having the frequency $f_1$, whilst the duplexer antenna 7 is operated only with microwave signals having the frequency $f_3$.

It will thus be appreciated that no changes whatsoever are necessary to the existing radar module 1 to make use of it for a level measurement at a substantially higher frequency than that for which is was conceived.

The described embodiment of the distance measuring device is operated in the pulsed method. Instead of the radar module 1 designed for this mode of operation a conventional radar module may be used which operates according to the frequency modulated continuous wave (FMCW) method, or any other radar module having a common duplexer port. Although the cited frequency values are particularly suitable for level measurements, it will be appreciated that other frequency values come into consideration, depending on the intended application.

When a waveguide system is used with a horn antenna the high-pass filter 6 of the frequency converter circuit 2 is superfluous since a waveguide system is of high-pass character.

We claim:

1. A radar level measuring device comprising:
   (a) an antenna for emitting microwaves toward the surface of a material in a container and for receiving the echo waves reflected from the surface;
   (b) a radar module having an input/output port for delivering a microwave signal having a first frequency $f_1$, the radar module comprising an evaluation circuit for determining, from the received echo signals, the transit time of the microwaves to the material surface and back; and
   (c) a frequency converter circuit having a first converter circuit port connected to the input/output port of the radar module and a second converter circuit port connected to the antenna, the frequency converter circuit comprising:
      (1) a local oscillator for generating an output signal having a second frequency $f_2$, the local oscillator including an output port;
      (2) a mixer having
         (i) a first mixer port connected to the output port of the local oscillator;
         (ii) a second mixer port through which signals can be transmitted to and received from the radar module; and
         (iii) a third mixer port through which signals can be transmitted to and received from the antenna;
      (3) a low pass filter having a cut-off frequency that is higher than the first frequency $f_1$, the low pass filter having a first low pass filter port connected to the first converter circuit port and a second low pass filter port connected to the second mixer port; and
      (4) a high pass filter having a cut-off frequency that is less than a third frequency $f_3$ corresponding to the sum of the first frequency $f_1$ and the second frequency $f_2$, the high pass filter having a first high pass filter port connected to the second converter circuit port and a second high pass filter port connected to the third mixer port;
   wherein the mixer is adapted for
   1. mixing the output signal from the local oscillator having the second frequency $f_2$ with the signal from the radar module having the first frequency $f_1$, to generate signals delivered at the third mixer port having the third frequency $f_3$ and a frequency corresponding to the difference of the first frequency $f_1$ and the second frequency $f_2$; and
   2. mixing the output signal from the local oscillator having the second frequency $f_2$ with a signal from the antenna having the third frequency $f_3$, to generate signals delivered to the second mixer port having a frequency corresponding to the sum of the second frequency $f_2$ and the third frequency $f_3$ and the first frequency $f_1$ corresponding to the difference of the second frequency $f_2$ and the third frequency $f_3$ wherein a bi-directional signal path is established between the radar module and the antenna via the two converter circuit ports of the frequency converter circuit, the low pass filter the mixer, and the high pass filter to permit use of the radar module delivering the first frequency $f_1$ for level measurement at the third frequency $f_3$ which is higher than the first frequency $f_1$.

2. The level measuring device as set forth in claim 1, wherein the third frequency $f_3$ is at least twice the first frequency $f_1$.

3. The level measuring device as set forth in claim 2, wherein the first frequency $f_1$ is about 5.8 GHz and the third frequency $f_3$ is about 24 GHz.

* * * * *